United States Patent [19]

Doluca et al.

[11] Patent Number: 4,769,784
[45] Date of Patent: Sep. 6, 1988

[54] CAPACITOR-PLATE BIAS GENERATOR FOR CMOS DRAM MEMORIES

[75] Inventors: Sinan Doluca, Santa Clara; Robert Yau, Cupertino, both of Calif.

[73] Assignee: Advanced Micro Devices, Inc., Sunnyvale, Calif.

[21] Appl. No.: 897,893

[22] Filed: Aug. 19, 1986

[51] Int. Cl.$^4$ .............................................. G11C 11/24
[52] U.S. Cl. .................... 365/149; 365/189; 365/226; 307/297
[58] Field of Search ............... 365/149, 189, 226, 227; 307/297, 296 R

[56] References Cited

U.S. PATENT DOCUMENTS

| | | | |
|---|---|---|---|
| 3,909,631 | 9/1975 | Kitagawa | 307/297 |
| 4,259,729 | 3/1981 | Tokushige | 365/149 |
| 4,375,596 | 3/1983 | Hoshi | 307/297 |
| 4,581,546 | 4/1986 | Allan | 307/297 |
| 4,593,382 | 6/1986 | Fujishima et al. | 365/149 |
| 4,670,861 | 6/1987 | Shu et al. | 365/226 |

Primary Examiner—Stuart N. Hecker
Assistant Examiner—Glenn A. Gossage
Attorney, Agent, or Firm—Davis Chin; Eugene H. Valet

[57] ABSTRACT

A capacitor-plate bias generator produces a voltage on the capacitor plate node which consists of a constant voltage plus the sense-level voltage. Consequently, the capacitor-plate node tracks any variations in the sense-level voltage. The constant voltage is $3V_{BG}$, or 3 times the bandgap voltage of silicon. The circuit includes a reference-voltage source which produces the sum of the sense-level voltage and $V_{BG}$, and a feedback control circuit for enabling either a charge pump or a charge bleeder to regulate the capacitor-plate voltage at a level above the circuit supply voltage.

25 Claims, 3 Drawing Sheets

CAPACITOR-PLATE BIAS GENERATOR FOR CMOS DRAM MEMORIES

BACKGROUND OF THE INVENTION

The present invention relates generally to dynamic read-write randomly accessible memory devices (DRAMs), more particularly to dynamic RAMs which use a grooved-surface structure to achieve a very high density of capacitive memory elements, and especially to a capacitor-plate bias generator circuit for such memory devices.

Digital information is stored in the form of capacitive charge in a matrix-array of many capacitive elements in the DRAM memory device. Recently, certain advances in the manner of forming the capacitive memory elements have increased the density of memory elements on each silicon wafer or chip.

One such advance has involved the provision of a grooved-surface microstructure on the silicon wafer, such that the surface area available for the formation of capacitive memory elements is increased substantially as compared to the planar structures formerly in use. However, the use of such a groove technology in forming the capactive elements has resulted in changes in the capacitor structure which have set new requirements for the capacitor-plate bias voltage, as will appear from the detailed discussions later in this patent application.

In order that the newer groove technology results in reliable memory devices having the desired characteristics of high density and very low soft error rate, a new capacitor-plate bias generator circuit was needed. For reasons which will be discussed in the later portions of this application, the bias generator must generate a voltage which is higher than the $V_{CC}$ voltage in use in the device, must be stable over a wide range of operating conditions, and must be insensitive to normal process and temperature variations.

DESCRIPTION OF THE RELATED ART

A copending application, entitled *Midpoint Sense Amplification Scheme for a CMOS DRAM*, Ser. No. 06/740,356, filed June 3, 1985, now U.S. Pat. No. 4,694,205 and commonly assigned with the present invention, covers a novel system for controlling the sense amplification rate at the inputs of a CMOS sense amplifier. Like the present invention, the system is designed for use in a midpoint sensing scheme, i.e., one in which the 1 and 0 logic states of the memory cells are represented by $V_{CC}$ volts and 0 volts, respectively, and the bit-lines are pre-charged at the beginning of each sense cycle to the midpoint of these two voltages, which is $V_{CC}/2$.

The above copending application also contains citations to other related art describing CMOS DRAMS using a similar sense cycle in which the bit-lines are pre-charged to a $V_{CC}/2$ level. As will appear from the later descriptions of this application, such schemes ideally require that the voltages across the capacitive memory elements be referenced to a voltage which is dependent upon and tracks the $V_{CC}/2$ voltage of the bit-lines.

SUMMARY OF THE INVENTION

An object of the present invention is to produce a capacitor-plate bias voltage suitable for use in a CMOS DRAM using a $V_{CC}/2$ sense scheme.

A second object of the present invention is to produce such a capacitor-plate bias voltage such that the voltage depends upon and tracks the variations of the $V_{CC}/2$ voltage.

A third object of the present invention is to produce such a capacitor-plate bias voltage having a magnitude of $V_{CC}/2+K$, where K is a constant.

A fourth object of the present invention is to produce a capacitor-plate bias voltage having a magnitude greater than $V_{CC}$.

A fifth object of the present invention is to produce a capacitor-plate bias voltage having a magnitude greater than $V_{CC}$ without requiring a source of voltage higher than $V_{CC}$.

To the above ends, a capacitor-plate bias generator according to the present invention includes a reference generator which produces a stable output voltage having a value of $V_{CC}/2+V_{BG}$, where $V_{BG}$ is the bandgap voltage of Silicon. The output voltage of this reference generator is coupled to one input of a charge-pump enable circuit, a second input of which is derived from the output or capacitor-plate voltage.

A charge pump under the control of the charge-pump enable circuit is used to pump sufficient charge into the capacitor-plate node to raise its voltage above the $V_{CC}$ level. The charge pump may, for example, raise the voltage of this node to approximately $V_{CC}/2+3V_{BG}$.

The output voltage of the reference generator is also coupled to one input of a capacitor-plate bleeder circuit, a second input of which is derived from the output or capacitor-plate voltage. The capacitor-plate bleeder circuit establishes an upper voltage limit for the capacitor-plate node. When this limit is reached, a charge bleeder is activated to reduce the voltage slightly.

Together, the charge pump and charge bleeder are operated in such a way as to cause the capacitor-plate voltage to remain within a narrow range around a design voltage chosen large enough to permit the use of $V_{CC}$ volts as the logic 1 voltage and 0 volts as the logic 0 voltage.

The above and other features, objects, and advantages of the present invention, together with the best mode contemplated by the inventors for carrying out their invention will become more apparent from reading the following detailed description of the invention and from studying the associated drawing, the various figures of which represent:

DETAILED DESCRIPTION OF THE PRESENT INVENTION

Figure 1:
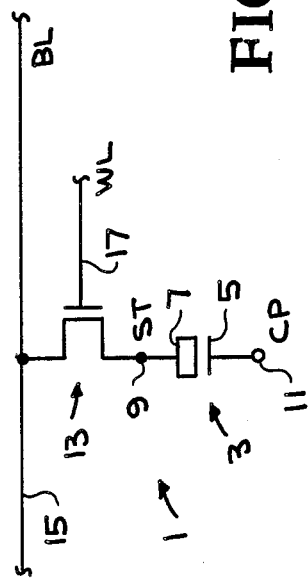
FIG. 1 is a simplified showing of a single capacitive memory cell according to the present invention.

In FIG. 1, a single capacitive memory cell 1 has been illustrated in a much simplified and idealized form. A capacitive memory element 3 has an anode electrode 5 and a cathode electrode 7. Cathode 7 is connected to a storage node 9, while anode electrode 5 is connected, in common with the anodes of the other capacitive memory elements in the matrix-array memory device (not shown) of which cell 1 is a part, to a capacitor-plate node 11.

A single data bit is stored in cell 1 and is represented by the voltage of storage node 9. Access to node 9 is controlled by a word-select gate transistor 13 which couples node 9 to a bit-line 15 whenever the potential on a word-line 17 goes high.

In one preferred scheme, logic 0 data is represented by 0 volts on node 9, logic 1 data is represented by a voltage of $V_{CC}$ on node 9, and bit-line 15 is pre-charged to a voltage which is the midpoint of these values, or $V_{CC}/2$ prior to connecting bit-line 15 to node 9 to read the data in cell 1.

Capacitor 3 is formed with a silicon cathode, a polysilicon anode, and with a relatively thin dielectric layer of, for example, 150 Angstroms of $SiO_2$ separating its cathode and anode. Such a capacitive structure has a threshold voltage $V_T$ of approximately 0.4 to 1.0 volts, depending on temperature. Consequently, the capacitor-plate node 11 must always be held at a voltage which is more positive than the voltage of the storage node 9 by $V_T$ volts or more.

On the other hand, the relatively thin dielectric layer establishes an upper limit of about 10 volts that can safely be supported without fear of destruction of the dielectric. When the data in cell 1 is a 0, the voltage across capacitor 3 is $V_{CP}$, the voltage of capacitor-plate node 11.

Since the voltage level at which sensing occurs is the voltage of bit-line 15, an optimum voltage source for biasing the capacitor-plate node 9 should track this bit-line voltage. Finally, since the bit-line pre-charge voltage is $V_{CC}/2$, the voltage of the capacitor-plate bias source should be function of $V_{CC}/2$ such that it follows any variations of bit-line voltage exactly.

Taking these requirements together, we can say that the ideal capacitor-plate bias source should produce a voltage:

$V_{CP} = V_{CC}/2 + K$, where K is a constant having a value:

$K > V_{CC}/2 + V_T$

If we consider that nominal values for $V_{CC}$ and $V_T$ might be on the order of 5 volts and 1 volt respectively, then the above relations suggest that K might be chosen to be 3.5 to 4, resulting in a value of $V_{CP}$ of approximately 6 to 6.5 volts. The requirement that $V_{CP}$ track $V_{CC}/2$ results in that $V_{CP}$ must increase or decrease by 0.5 volt in response to a 1.0 volt increase or decrease in $V_{CC}$, for example.

Figure 2:
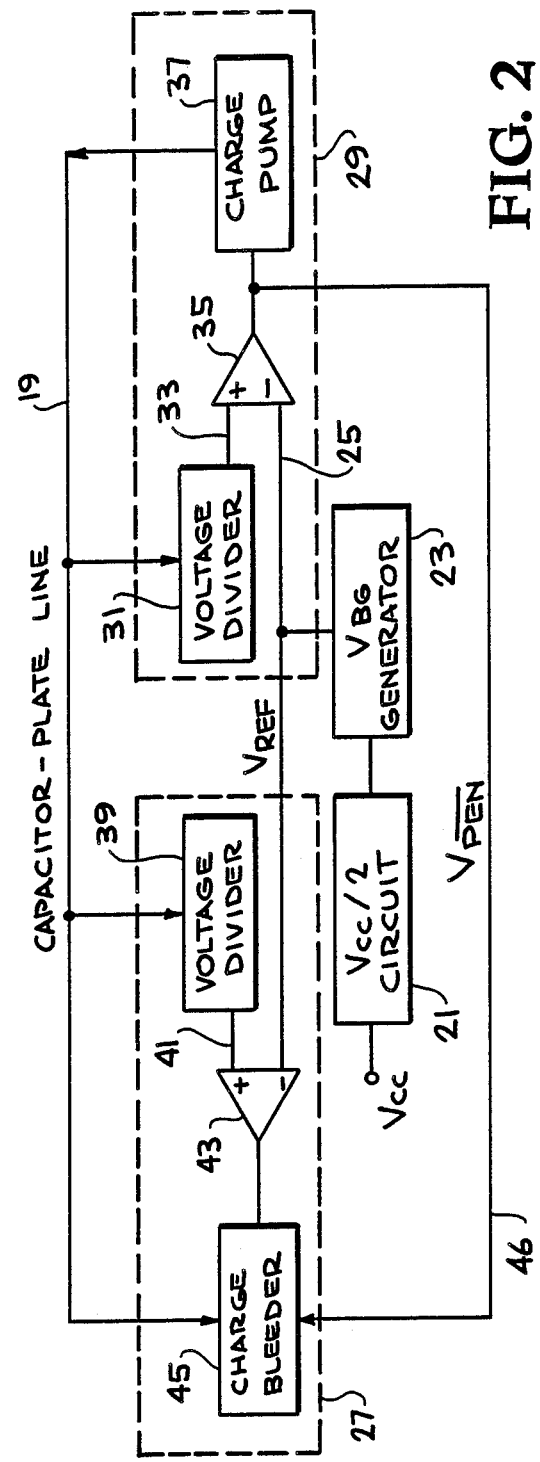
FIG. 2 is a block-schematic representation of a capacitor-plate bias circuit according to the present invention.

Turning now to FIG. 2, the circuit arrangement necessary to provide the capacitor-plate bias according to the present invention is shown in block-schematic form. A capacitor-plate line 19 at the top of the figure represents all the capacitor-plate nodes 11 of FIG. 1 whose voltage must be established and maintained in accordance with the foregoing criteria.

A $V_{CC}/2$ circuit 21, which may be nothing more than a voltage divider, connects to a source of voltage $V_{CC}$ at its input, and provides a voltage $V_{CC}/2$ to a $V_{BG}$ generator 23 at its output. $V_{BG}$ generator 23 generates a voltage $V_{BG}$ which is a stable facsimile of the bandgap voltage of silicon, or about 1.2 volts. Any of the known circuits for producing $V_{BG}$, such as the one discussed at pp. 254–261 of *Analysis and Design of Analog Integrated Circuits* by Gray and Meyer, published by John Wiley, 1977, may be used as $V_{BG}$ generator 23.

The output of generator 23, consisting of the sum of $V_{CC}/2$ and $V_{BG}$ is connected to a $V_{REF}$ line 25, such that:

$V_{REF} = V_{CC}/2 + V_{BG}$

The function of the remainder of the circuitry of FIG. 2 can be summarized as the utilization of $V_{REF}$ to establish and maintain a voltage on line 19 of $V_{CC}/2 + K$, in accordance with the discussion of FIG. 1 above. The method of doing this involves the periodic pumping of charge into line 19 to raise its potential and the periodic bleeding of charge from line 19 to lower its potential.

A bleeder control circuit 27, enclosed within the left dotted line produces and controls a bleeding of charge from the line 19, while a pump control circuit 29, enclosed within the right dotted line produces and controls the pumping of charge onto line 19.

As can be surmised from a brief study of FIG. 2, each of circuits 27 and 29 uses a scheme which may be summarized as follows: Derive a voltage which is a certain fraction of the voltage on line 19, compare this voltage with the $V_{REF}$ voltage on line 25, and turn the charge pump or charge bleeder on or off in response to the difference between these two voltages.

Pump control circuit 29 thus includes a voltage divider 31 having an input connected to line 19 and having an output line 33 connected to one input of a comparator 35. As will be shown in the later detailed description of the circuitry used to realize the function of pump control circuit 29, the voltage produced on line 33 by divider 31 is:

$V_{33} = (V_{CP} - V_{CC}/2)/3 + V_{CC}/2.$

Comparator 35 compares $V_{33}$ with $V_{REF}$ and produces at its output a signal which turns on a charge pump 37 whenever $V_{33} \leq V_{REF}$ Since $V_{REF} = V_{CC}/2 + V_{BG}$, this turn-on condition may be restated as:

$[(V_{CP} - V_{CC}/2)/3] \leq V_{BG}$, or $[V_{CP} \leq 3V_{BG} + V_{CC}/2.$

Bleeder control circuit 27 includes a voltage divider 39 having an input connected to line 19 and having an output line 41 connected to one input of a comparator 43. The voltage produced on line 41 by divider 39 is:

$V_{41} = (V_{CP} - V_{CC}/2)/3 + V_{CC}/2 - \Delta.$

Thus $V_{41}$ differs from $V_{33}$ above only by a small offset voltage $\Delta$. Comparator 43 compares the voltage on line 41 with $V_{REF}$ and produces at its output a signal which turns on a charge bleeder 45 whenever $(V_{CP} - V_{CC}/2)/3 + V_{CC}/2 - \Delta \geq V_{REF}.$ It can be shown that this bleeder turn-on condition ensures that:

$$V_{CP} \leq 3V_{BG} + V_{CC}/2 + 3\Delta.$$

Considering the pump and bleeder turn-on conditions together, it can be seen that the voltage on line 19 will be regulated between:

$$3V_{BG} + V_{CC}/2 \leq V_{CP} \leq 3V_{BG} + V_{CC}/2 + 3\Delta$$

In the interest of minimizing wasted power, the pump and bleeder should not operate simultaneously. The circuit of FIG. 2 provides two mechanism for avoiding such simultaneous operation: (1) the voltage $V_{CP}$ at which the bleeder turns off is greater than the voltage $V_{CP}$ at which the pump turns on by $3\Delta$; (2) the $V_{\overline{PEN}}$ voltage produced by comparator 35 is fed back along line 46 to bleeder control circuit 27, where it disables charge bleeder 45 whenever charge pump 37 is in operation.

Figure 3:
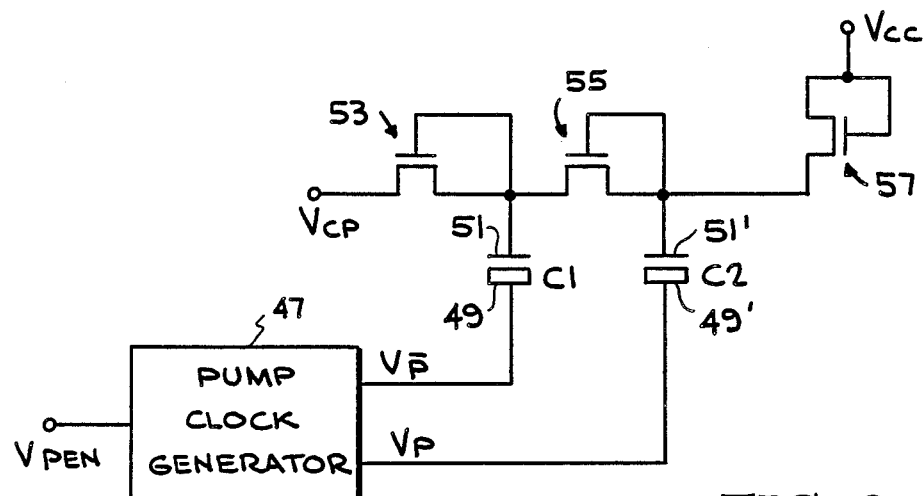
FIG. 3 is a schematic representation of a charge pump according to the present invention.
Figure 4:
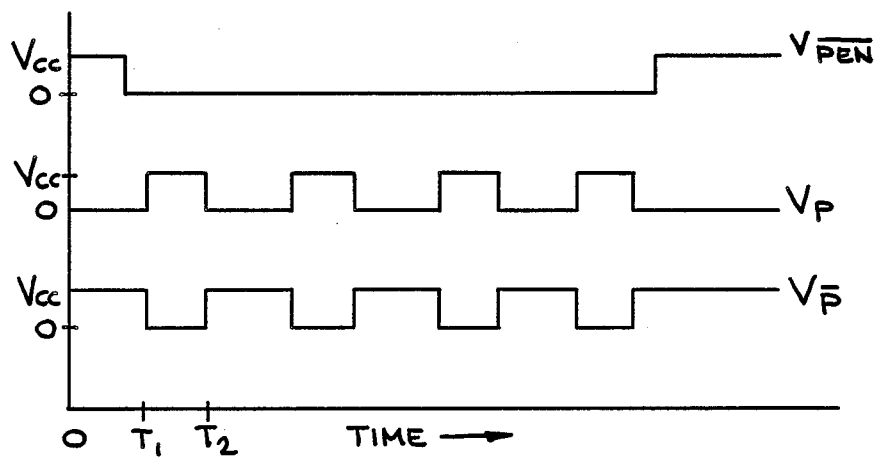
FIG. 4 is a timing diagram of voltage waveforms in the circuit of FIG. 3.

Turning now to FIGS. 3 and 4, a circuit realization of charge pump 37 is shown to include a pump clock generator 47, represented in schematic-block form. Clock generator 47 receives a negative-going pump-enabling input signal $V_{\overline{PEN}}$ and produces in response a biphase pair of output signals $V_P$ and $V_{\bar{p}}$. These output signals are in turn connected to the cathode electrodes 49 and 49' of a pair of capacitors C1 and C2, the anode electrodes 51 and 51' of which connect to a pair of pass transistors 53 and 55. A charging transistor 57 supplies current from a source of voltage $V_{CC}$.

In the following discussion of the operation of this pump, it will be assumed that each of transistors 53, 55, and 57 has a threshold voltage of $V_T$ volts, representing a loss or drop in voltage during conduction. However, capacitors C1 and C2 are assumed to have a negligible threshold voltage by being realized in a form, and with doping levels chosen, to eliminate their $V_T$.

Prior to the start of the operational cycle, i.e., at time 0 in FIG. 4, anode 51' will have been charged to a voltage of $V_{CC} - V_T$ volts by transistor 57. Consequently, when signal $V_p$ drives cathode 49' from 0 volts to $V_{CC}$ volts at time $T_1$, anode 51' is also raised in potential, and would reach a voltage of $2V_{CC} - V_T$ but for the fact that pass transistors 55 turns on, causing the charge on anode 51' to be shared with anode 51. During the next change of phase of the biphase signals, some of this charge is transferred to the terminal $V_{CP}$ through pass transistor 53.

Terminal $V_{CP}$ is connected to capacitor plate line 19 in FIG. 2, such that this line is gradually pumped to a higher potential throughout the duration of the pump-enabling signal $V_{\overline{PEN}}$. The limiting potential which can be reached using this pump design is $3V_{CC} - 3V_T$. Since $V_T$ may be up to 1.5 volt, this pumping limit may be approximately 10 volts for a $V_{CC}$ value of 5.

Figure 5:
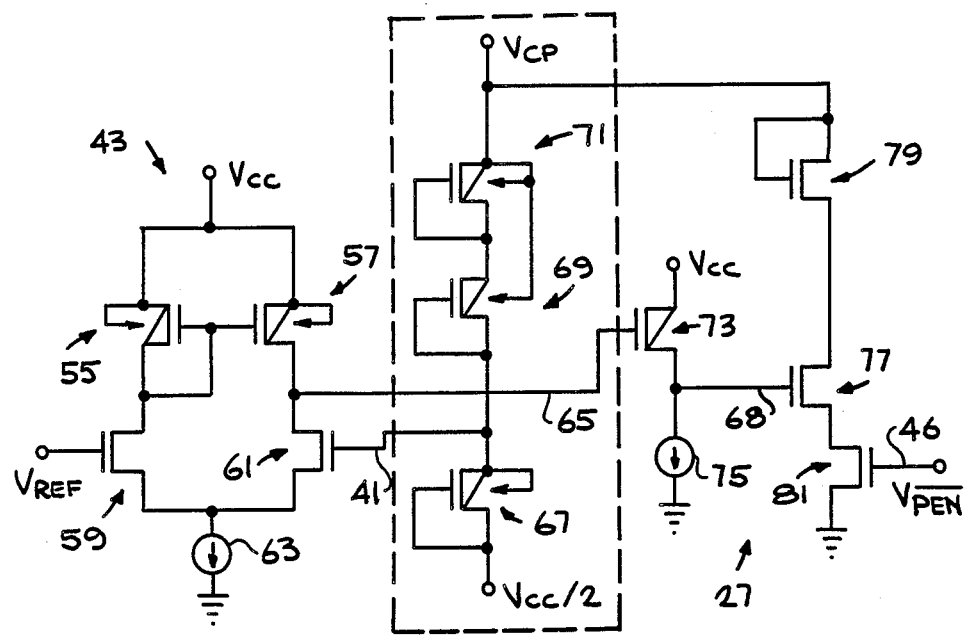
FIG. 5 is a schematic diagram of the circuit within the left dotted rectangle in FIG. 2.
Figure 6:
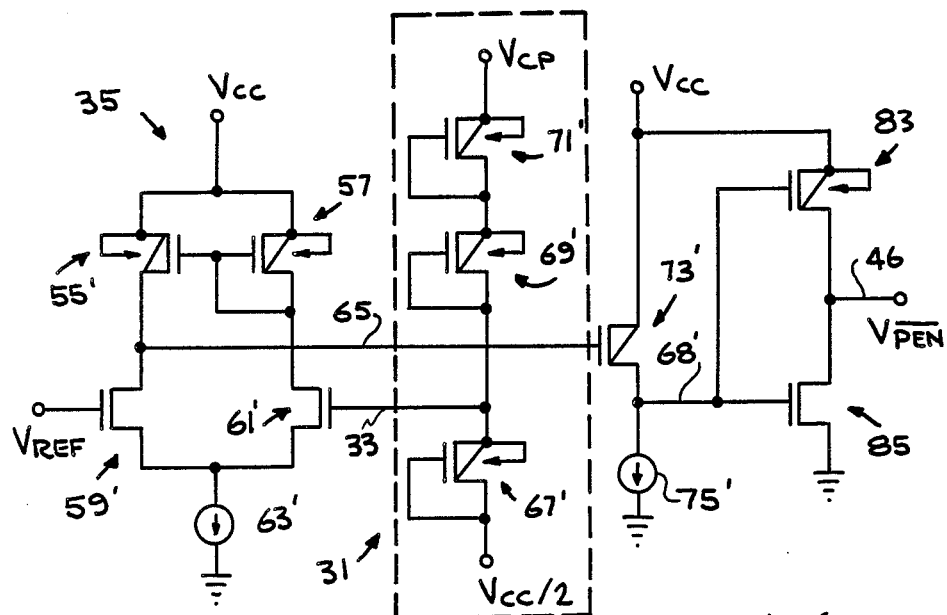
FIG. 6 is a schematic diagram of a portion of the circuit within the right dotted rectangle in FIG. 2.

FIG. 5 shows, in schematic form, the details of a circuit which realizes the functions of bleeder control circuit 27 in FIG. 2. FIGS. 5 and 6 are illustrated as the corresponding circuits which would be if formed using an n-well process technology. That is, n-channel transistors are assumed to be formed directly in the p-substrate, while p-channel transistors, formed in an n-well in the p-substrate, are illustrated including an arrow symbolizing the n-well substrate.

In all except one of the p-channel transistors, the n-well substrate connects to the source electrode of the same transistor, as shown in FIGS. 5 and 6. It will be understood, however, that the present invention is equally applicable to devices utilizing p-well process technology, such that n-channel transistors would be formed in a p-well.

Comparator 43 is shown to include a pair of p-channel transistors 55 and 57, each having its source connected to $V_{CC}$, and a pair of n-channel transistors 59 and 61, connected as a differential pair to a current source 63. The gate electrodes of transistors 55 and 57 are commonly connected to the drain electrode of transistor 59. An output driver transistor 73 receives the drain voltage of transistor 61 on line 65, connected to the gate of transistor 73. The source of transistor 73 is connected to $V_{CC}$, while its drain is connected to a current source 75.

The gate of transistors 59 receives the $V_{REF}$ voltage from line 25 in FIG. 2, while the gate of transistor 61 is connected to line 41 to receive the output from voltage divider 39. Comparator 43 has very high gain, on the order to 10,000, and produces an output on line 68 which swings form 0 volts to $V_{CC}$ volts when the voltage on line 41 exceeds $V_{REF}$ by a few millivolts.

Voltage divider 39 consists of a series string of three p-channel transistors 67, 69, and 71, each with its gate and drain electrodes interconnected. The $V_{CP}$ input from line 19 in FIG. 2 is connected to the source of transistor 71, while the drain of transistor 67 is connected to a voltage of $V_{CC}/2$. Thus, the voltage drop across the entire divider chain is $V_{CP} - V_{CC}/2$. Since line 41 connects to the source of transistor 67, the lowest in the chain of three, the voltage at this point would, if the three transistors were identically formed and connected, be:

$$[(V_{CP} - V_{CC}/2)/3] + V_{CC}/2.$$

However, the symmetry of divider 39 has been deliberately disturbed by connecting the substrate of transistor 69 to the source of transistor 71, while the substrates of each of transistors 71 and 67 is connected in the normal manner, each one to the source of its own transistor. The effect of this asymmetry is to cause the voltage drop across transistor 69 to be increased by a small amount while the voltage drop across each of the other transistors is decreased by a small amount.

If we arbitrarily call the increase in the voltage across transistor 69 $2\Delta$, then the decrease in drop across each of the other transistors is one half of this amount, or $\Delta$. Consequently, the voltage output from divider 39 at line 41 is:

$$V_{41} = [(V_{CP} - V_{CC}/2)/3] + V_{CC}/2 - \Delta,$$

as was stated above in the description of FIG. 2.

The drain electrode of transistor 73 is connected to the gate of a transistor 77. The drain of transistor 77 is coupled, through a current-regulating transistor 79, to $V_{CP}$ on line 19 of FIG. 2. Transistor 79 serves as a non-linear current regulator having a generally parabolic current-voltage characteristic.

A gate transistor 81 is connected with its drain to the source of transistor 77, and with its source to ground. The gate of transistor 81 receives the $V_{\overline{PEN}}$ voltage on the line 46 and disables the bleeder 27 whenever charge pump 37 is on.

In FIG. 6, the circuitry for realizing the pump control circuit 29 fo FIG. 2 is shown. Primed reference numbers indicate parts of FIG. 6 which correspond with unprimed reference numbers in FIG. 5. The comparator 35 is very similar to the comparator 43 discussed above with respect to FIG. 5, and differs only in the following respects: The common gate connection of p-channel transistors 55' and 57' is connected to the drain of transistor 61', and the comparator output line 65' connects to the drain of transistor 59'.

Similarly, voltage divider 31 functions exactly like voltage divider 39 except that it is entirely symmetrical, such that the output voltage produced by divider 31 on line 33 is ⅓ of the voltage difference across the entire divider string plus $V_{CC}/2$, or:

$$V_{33} = (V_{CP} - V_{CC}/2)/3 + V_{CC}/2,$$

which agrees with the expression for this voltage above in the discussion of FIG. 2.

The output of comparator 35 on line 65' goes low whenever $V_{33}$ drops below $V_{REF}$, and this low output is coupled through a driver transistor 73' to the commonly connected gates of an inverting output pair of transistors 83 and 85. The high voltage on the common gate connection of these transistors turns transistor 83 off, and transistor 85 on. As a result, the output voltage on the line 46 drops, initiating the active low $V_{\overline{PEN}}$ output signal on line 46.

Although this invention has been described with some specificity in reference to embodiments thereof which represent the best mode known to the inventors for carrying out their invention, many changes could be made and many alternative embodiments could thus be derived without departing from the scope of the invention. Consequently, the scope of the invention is to be determined only from the following claims.

We claim:

1. In a dynamic, randomly-accessible memory (DRAM) of the type employing capacitive memory elements, each of said memory elements having an anode and a cathode, wherein a bit-line, pre-charged to a predetermined voltage prior to sensing data in a memory element, accesses the cathode of a memory element to sense the data therein, the anodes of all the capacitive memory elements being connected in common to a capacitor-plate node, a capacitor-plate bias generator for establishing and maintaining a voltage on said capacitor-plate node, comprising in combination;

charge pump means for pumping electrical charge into said capacitor-plate node, to thereby raise the potential of said node;

charge bleeder means for bleeding charge from said capacitor-plate node, to thereby lower the potential of said node;

a source of reference voltage;

feedback control means for comparing the voltage of said capacitor-plate node to said reference voltage and for initiating operation of a selected one of said charge pump means and said charge bleeder means to maintain said capacitor-plate voltage within a preselected range of voltages;

said feedback control means being formed of a pump control circuit and a bleeder control circuit;

said pump control circuit including first voltage divider means for deriving a first control voltage having a known relationship with the voltage of said capacitor-plate node, first comparator means for comparing said first control voltage with said reference voltage and for producing in response to the difference therebetween a first error voltage, and pump drivers means responsive to said first error voltage for producing a pump-enabling signal when said first control voltage is less than said reference voltage; and said bleeder control circuit including second voltage divider means for deriving a second control voltage having a known relationship with the voltage of said capacitor-plate node, second comparator means for comparing said second control voltage with said reference voltage and for producing in response to the difference therebetween a second error voltage, and bleeder means responsive to said second error voltage for producing a bleeding of charge from said capacitor-plate node when said second control voltage is greater than said reference voltage.

2. The apparatus of claim 1 wherein said bleeder control circuit further comprises bleeder gate means, connected to said pump control circuit to receive therefrom said pump enabling signal and responsive thereto to disable said bleeder means when said pump is enabled.

3. The apparatus of claim 1 wherein said charge pump means comprises:

a pump clock for receiving a pump-enabling input signal and for generating in response thereto a complementary pair of biphase alternating output signals;

a first capacitor having an anode, and having a cathode connected to receive a first of said biphase signals, and a second capacitor having an anode, and having a cathode connected to receive a second of said biphase signals;

charging means to charge said capacitors and to produce thereacross a voltage at each capacitor anode which is higher than the voltage at the capacitor cathode;

coupling means to couple one of said capacitor anodes to said capacitor-plate node whenever said one capacitor anode is at a voltage exceeding the voltage of said capacitor-plate node by a certain threshold voltage $V_T$, and to decouple said one capacitor anode otherwise.

4. The apparatus of claim 3 wherein the one of said capacitor anodes coupled to said capacitor-plate node is said first capacitor anode, and wherein said coupling means further couples said second capacitor anode to said first capacitor anode whenever the voltage on said second capacitor anode exceeds the voltage of said first capacitor anode by $V_T$.

5. The apparatus of claim 1 wherein said first and second control voltages differ.

6. The apparatus of claim 5 wherein said second control voltage is less than said first control voltage by a fixed deviation voltage Δ.

7. The apparatus of claim 5 wherein said first voltage divider means comprises a first series string of a plurality of n FET transistors, where n is an integer having a value of 2 or greater, each of said transistors in said first series string having a source, a drain, a gate, and a substrate connected to its source, and wherein said second voltage divider means comprises a second series string of a plurality of n FET transistors, where n is an integer having a value of 2 or greater, each of said transistors in said second series string having a source, a drain, a gate, and a substrate, one of said transistors in said second string having its substrate connected to a circuit node at a potential different from the potential of its source.

8. The apparatus of claim 1 wherein said reference voltage tracks variations in said predetermined voltage, whereby said capacitor-plate bias generator maintains said capacitor-plate node at a voltage which also tracks variations in said predetermined voltage.

9. The apparatus of claim 8 wherein said capacitor-plate bias generator maintains said capacitor-plate node at a voltage which consists of a constant voltage and said predetermined voltage.

10. The apparatus of claim 9 wherein said constant voltage is $3V_{BG}$, where $V_{BG}$ is the bandgap voltage of silicon.

11. The apparatus of claim 8 wherein said reference voltage consists of a constant voltage component and said predetermined voltage.

12. The apparatus of claim 11 wherein said constant voltage component is $V_{BG}$, the bandgap voltage of silicon.

13. The apparatus of claim 11 wherein said predetermined is $V_{CC}/2$ volts, where $V_{CC}$ is the common circuit supply voltage, and wherein said reference-voltage source comprises:
  voltage means, connected to said common circuit supply voltage $V_{CC}$, for producing a voltage $V_{CC}/2$ equivalent to said predetermined;
  voltage generator means for receiving said $V_{CC}/2$ voltage from said voltage divider means, for generating a constant voltage component, and for combining said $V_{CC}/2$ voltage and said constant voltage component to produce an output reference voltage.

14. The apparatus of claim 13 wherein said voltage generator means generates a constant voltage component $V_{BG}$ which is the bandgap voltage of silicon, and combines said $V_{CC}/2$ and $V_{BG}$ voltages to produce an output reference voltage $V_{REF}$ defined as:

$$V_{REF} = V_{CC}/2 + V_{BG}.$$

15. The apparatus of claim 14 wherein said capacitor-plate bias generator maintains said capacitor-plate voltage $V_{CP}$ at a value of $$3V_{BG} + VCC/2 \leq V_{CP} 3V_{BG} + VCC/2 + 3\Delta$$

where $\Delta$ is a deviation from $3V_{BG} + VCC/2$.

16. In a dynamic, randomly-accessibly memory (DRAM) of the type employing capacitive memory elements, each of said memory elements having an anode and a cathode, wherein a bit-line, pre-charged to a predetermined voltage prior to sensing of data in a memory element, accesses the cathode of a memory element to sense the data therein, the anodes of all the capacitive memory elements being connected in common to a capacitor-plate node, a capacitor-plate bias generator for establishing and maintaining a voltage on said capacitor-plate node, comprising in combination:
  charge pump means for pumping electrical charge into said capacitor-plate node, to thereby raise the potential of said node;
  charge bleeder means for bleeding charge from said capacitor-plate node, to thereby lower the potential of said node;
  reference-voltage-generating means for generating a reference voltage consisting of a constant voltage component and said predetermined voltage;
  feedback control means for comparing the voltage of said capacitor-plate node to said reference voltage and for initiating operation of a selected one of said charge pump means and said charge bleeder means to maintain said capacitor-plate voltage within a preselected range of voltages;
  said feedback control means being formed of a pump control circuit and a bleeder control circuit;
  said pump control circuit including first voltage divider means for deriving a first control voltage having a known relationship with the voltage of said capacitor-plate node, first comparator means for comparing said first control voltage with said reference voltage and for producing in response to the difference therebetween a first error voltage, and pump driver means responsive to said first error voltage for producing a pump-enabling signal when said first control voltage is less than said reference voltage; and
  said bleeder control circuit including second voltage divider means for deriving a second control voltage having a known relationship with the voltage of said capacitor-plate node, second comparator means for comparing said second control voltage with said reference voltage and for producing in response to the difference therebetween a second error voltage, and bleeder means responsive to said second error voltage for producing a bleeding of charge from said capacitor-plate node when said second control voltage is greater than said reference voltage.

17. The apparatus of claim 16 wherein said constant voltage component is $V_{BG}$, the bandgap voltage of silicon.

18. The apparatus of claim 16 wherein said bleeder control circuit further comprises bleeder gate means, connected to said pump control circuit to receive therefrom said pump enabling signal and responsive thereto to disable said bleeder means when said pump is enabled.

19. The apparatus of claim 16 wherein said capacitor-plate bias generator maintains said capacitor-plate node at a voltage which consists of a constant voltage and said predetermined voltage.

20. The apparatus of claim 19 wherein said constant voltage is $3V_{BG}$, where $V_{BG}$ is the bandgap voltage of silicon.

21. The apparatus of claim 16 wherein said predetermined voltage is $V_{CC}/2$ volts, where $V_{CC}$ is the common circuit supply voltage, and wherein said reference-voltage source comprises:
  voltage divider means, connected to said common circuit supply voltage $V_{CC}$, for producing a voltage $V_{CC}/2$ equivalent to said predetermined voltage;
  voltage generator means for receiving said $V_{CC}/2$ voltage from said voltage divider means, for generating a constant voltage component, and for combining said $V_{CC}/2$ voltage and said constant voltage component to produce an output reference voltage.

22. The apparatus of claim 21 wherein said voltage generator means generates a constant voltage component $V_{BG}$ which is the bandgap voltage of silicon, and combines said $V_{CC}/2$ and $V_{BG}$ voltages to produce an output reference voltage $V_{REF}$ defined as:

$$V_{REF} = V_{CC}/2 + V_{BG}.$$

23. The apparatus of claim 16 wherein said charge pump means comprises:

a pump clock for receiving a pump-enabling input signal and for generating in response thereto a complementary pair of biphase alternating output signals;

a first capacitor having an anode, and having a cathode connected to receive a first of said biphase signals, and a second capacitor having an anode, and having a cathode connected to receive a second of said biphase signals;

charging means to charge said capacitors and to produce thereacross a voltage at each capacitor anode which is higher than the voltage at the capacitor cathode;

coupling means to couple the first capacitor anode to said capacitor-plate node whenever said first capacitor anode is at a voltage exceeding the voltage of said capacitor-plate node by a certain threshold voltage $V_T$, and to couple the second capacitor anode to said first capacitor anode whenever the voltage on said capacitor anode exceeds the voltage of said first capacitor anode by $V_T$.

24. The apparatus of claim 23 wherein said first voltage divider means comprises a first series string of a plurality of n FET transistors, where n is an integer having a value of 2 or greater, each of said transistors in said first series string having a source, a drain, a gate, and a substrate connected to its source, and wherein said second voltage divider means comprises a second series string of a plurality of n FET transistors, where n is an integer having a value of 2 or greater, each of said transistors in said second series string having a source, a drain, a gate, and a substrate, one of said transistors in said second string having its substrate connected to a circuit node at a potential different from the potential of its source.

25. In a dynamic, randomly-accessibly memory (DRAM) of the type employing capacitive memory elements, each of said memory elements having an anode and a cathode, wherein a bit-line, pre-charged to a predetermined voltage prior to sensing data in a memory element of $V_{CC}/2$ where $V_{CC}$ is a common circuit supply voltage, accesses the cathode of a memory element to sense the data therein, the anodes of all the capacitive memory elements being connected in common to a capacitor-plate node, a capacitor-plate bias generator for establishing and maintaining a voltage on said capacitor-plate node, comprising in combination:

charge pump means for pumping electrical charge into said capacitor-plate node, to thereby raise the potential of said node;

charge bleeder means for bleeding charges from said capacitor-plate node, to thereby lower the potential of said node;

reference-voltage-generating means for generating a reference voltage consisting of a $V_{BG}$ the bandgap voltage of silicon, and said predetermined voltage $V_{CC}/2$; and, feedback control means for comparing the voltage of said capacitor-plate node to said reference voltage and for initiating operation of a selected one of said charges pump means and said charge bleeder means to maintain said capacitor-plate voltage at a voltage of substantially $V_{CC}/2$ and a constant voltage of $3V_{BG}$;

said feedback control means including:

a pump control circuit comprising:

first voltage divider means for deriving a first control voltage having a known relationship with the voltage of said capacitor-plate node;

first comparator means for comparing said first control voltage with said reference voltage and for producing in response to the difference therebetween a first error voltage;

pump driver means responsive to said first error voltage to produce a pump-enabling signal when said first control voltage is less than said reference voltage;

a bleeder control circuit comprising:

second voltage divider means for deriving a second control voltage having a known relationship with the voltage of said capacitor-plate node;

second comparator means for comparing said second control voltage with said reference voltage and for producing in response to the difference therebetween a second error voltage;

bleeder means responsive to said second error voltage to produce a bleeding of charge from said capacitor-plate node when said second control voltage is greater than said reference voltage.

* * * * *